(12) United States Patent
Kang

(10) Patent No.: US 6,324,090 B1
(45) Date of Patent: Nov. 27, 2001

(54) NONVOLATILE FERROELECTRIC MEMORY DEVICE

(75) Inventor: Hee Bok Kang, Daejeon-si (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/620,599

(22) Filed: Jul. 20, 2000

Related U.S. Application Data

(63) Continuation-in-part of application No. 09/620,600, filed on Jul. 20, 2000.

(30) Foreign Application Priority Data

Jul. 21, 1999 (KR) .................................................. 99-29646
Jul. 21, 1999 (KR) .................................................. 99-29647

(51) Int. Cl.[7] ...................................................... G11C 11/08
(52) U.S. Cl. .............................. 365/143; 365/208; 365/51
(58) Field of Search ................................... 365/207, 208, 365/189.11, 51, 145, 149, 230.03

(56) References Cited

U.S. PATENT DOCUMENTS 4,873,664  10/1989  Eaton, Jr. ............................. 365/145
6,011,738 * 1/2000  Son ...................................... 365/207

* cited by examiner

*Primary Examiner*—A. Zarabian
(74) *Attorney, Agent, or Firm*—Fleshner & Kim, LLP

(57) ABSTRACT

A nonvolatile ferroelectric memory device is provided that has a plurality of cell arrays in a matrix and includes a plurality of pull-down sensing amplifiers between adjacent cell arrays arranged in a vertical direction that pull-down amplify a data in a corresponding cell array and a pull-up amplifier. The pull-up amplifier between the vertically adjacent cell arrays is shared by an upper and a lower cell arrays to selectively pull-up amplify a data in the upper cell array or data in the lower cell array. The nonvolatile ferroelectric memory device having the plurality of vertically arranged cell arrays efficiently reduces a layout and ensures a stability of amplification by dividing a structure of a sensing amplifier formed between cell arrays into the pull-down sensing amplifiers and the pull-up sensing amplifier, and subsequently making the pull-up sensing amplifier shared by the upper cell array and the lower cell array.

21 Claims, 17 Drawing Sheets

NONVOLATILE FERROELECTRIC MEMORY DEVICE

This is a Continuation-in-part (CIP) of prior application U.S. Ser. No. 09/620,600 filed concurrently filed on Jul. 20, 2000. The entire disclosure of the prior application is considered as being part of the disclosure of the accompanying application and is hereby incorporated by reference therein.

BACKGROUND OF THE INVENTION

1. Field of the Invention

The present invention relates to a nonvolatile ferroelectric memory device, and more particularly, to a sense amplifier for a nonvolatile ferroelectric memory device.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. A low signal is applied to the bitline, and if the signal applied to the plate line is high, a logic value "0" is written in the ferroelectric capacitor.

With reference to FIG. 3b, the reading operation of data stored in a cell by the above operation of the write mode will now be described. If an externally applied chip enable signal CSBpad is activated from high state to low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in hysteresis loop of FIG. 1. If the data is not destroyed, "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the data to the original data, the plate line becomes inactive from high state to low state at the state that the high signal is applied to the corresponding wordline.

FIG. 4 is a block diagram showing the related art nonvolatile ferroelectric memory device having a cell structure of 1T/1C. As shown in FIG. 4, the related art nonvolatile ferroelectric memory device includes a main cell array 41, a reference cell array 42 assigned on a lower part of the main cell array 41, a wordline driver 43 formed at a side of the main cell array for applying a driving signal to the main cell array 41 and the reference cell array 42, and a sensing amplifier 44 formed at a lower part of the reference cell array 42.

The wordline driver 43 applies the driving signal to a main wordline of the main cell array 41 and a reference wordline of the reference cell array 42. The sensing amplifier 44 includes a plurality of sensing amplifiers and amplifies signals of a corresponding bitline B/L and bit bar line BB/L.

The operation of the related art nonvolatile ferroelectric memory device will now be described with reference to FIG. 5. FIG. 5 is a partially detailed view of FIG. 4. As shown in the drawing, the main cell array has a folded bitline structure in the same manner as DRAM.

Also, the reference cell array 42 has a folded bitline structure and includes a reference cell wordline and a reference cell plate line in pairs. At this time, reference cell wordline and the reference cell plate line pairs are defined as RWL_1 and RPL_1, and RWL_2 and RPL_2, respectively.

When the main cell wordline MWL_N-1 and the main cell plate line MPL_N-1 are activated, the reference cell wordline RWL_1 and the reference cell plate line RPL_1 are activated. Therefore, data in the main cell is loaded into the bitline B/L and data in the reference cell is loaded into the bit bar line BB/L.

When the main cell wordline MWL_N and the main cell plate line MPL_N are activated, the reference cell wordline RWL_2 and the reference cell plate line RPL_2 are activated. Therefore, data in the main cell is loaded into the bit bar line BB/L and data in the reference cell is loaded into the bitline B/L.

The reference voltage REF by the reference cell exists between the bitline levels B_H(high) and B_L(low) by the main cell. To generate the reference voltage REF between the bitline levels B_H and B_L, the logic value "1" or "0" may be stored in a capacitor of the reference cell. When the logic value "1" is stored in the capacitor of the reference cell, the size of the capacitor of the reference cell is smaller than that of the capacitor of the main cell. When the logic value "0" is stored in the capacitor of the reference cell, the size of the capacitor of the reference cell is greater than that of the capacitor of the main cell.

FIG. 6 is a diagram illustrating one of the plurality of sensing amplifiers constituting the sensing amplifier of FIG. 4. As shown in FIG. 6, the related art sensing amplifier has a structure of a latch type sensing amplifier.

In other words, the sensing amplifier in FIG. 6 includes two PMOS transistors and two NMOS transistors, and these PMOS and NMOS transistors have latch type inverter structures. The first PMOS transistor MP1 and the second PMOS transistor MP2 face each other. An output terminal of the first PMOS transistor MP1 is connected to a gate of the second PMOS transistor MP2, and an output terminal of the second PMOS transistor MP2 is connected to a gate of the first PMOS transistor MP1. An SAP signal is commonly applied to input terminals of the first and second PMOS transistors MP1 and MP2. The SAP signal is an active signal that activates the first and second PMOS transistors MP1 and MP2.

The first NMOS transistor MN1 is connected to the output terminal of the first PMOS transistor MP1 in series. The second NMOS transistor MN2 is connected to the output terminal of the second NMOS transistor MN2 in series. The output terminal of the second NMOS transistor MN2 is connected to a gate of the first NMOS transistor MN1, and the output terminal of the first NMOS transistor MN1 is connected to a gate of the second NMOS transistor MN2.

An SAN signal is commonly applied to input terminals of the first and second NMOS transistors MN1 and MN2. The SAN signal is an active signal that activates the first and second NMOS transistors MN1 and MN2.

The output terminals of the first PMOS transistor MP1 and first NMOS transistor MN1 are commonly connected to the bitline B_N. The output terminals of the second PMOS transistor MP2 and the second NMOS transistor MN2 are connected to the next bitline B_N+1.

The output of the sensing amplifier is respectively connected to the bitlines B_N and B_N+1 to be input and output to the main cell and the reference cell, respectively, thereby enabling input/output to the main cell and the reference cell.

The SAP signal, the SAN signal, and the signals of B_N and B_N+1 are all maintained at ½ Vcc for a precharge period when the sensing amplifier is not active. On the other hand, the SAP signal is pulled-up at high level and the SAN signal is pulled-down at low level.

FIG. 7 shows a system for sensing an upper cell array and a lower cell array using the related art sensing amplifier. The reference numeral '41a' denotes the upper cell array, and '41b' denotes the lower cell array. To sense data in the upper cell array, a TSEL signal, which is a control signal, is transited to a high level and a BSEL signal, which is a control signal, is transited to a low level. Accordingly, a path between the lower cell array and the sensing amplifier is blocked, and a path between the upper cell array and the sensing amplifier is opened. Then, the sensing amplifier senses the signal on the bit line and the bit bar line in the upper cell array.

To sense the data in the lower cell array, the TSEL signal is transited to a low level and the BSEL signal is transited to a high level. Accordingly, a path between the upper cell array and the sensing amplifier is blocked, and a path between the upper cell array and the sensing amplifier is opened. The sensing amplifier senses the signal of the bit line and the bit bar line of the lower cell array.

As described above, the related art nonvolatile ferroelectric memory device has various disadvantages. Since an input terminal of the sensing amplifier is directly connected to the upper and lower bit lines through a switching device, loads between the bit line and the bit bar line may differ. Accordingly, since an amplification may occur in a state of different loads, the amplification may become unstable.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the present invention is to provide a nonvolatile ferroelectric memory device that substantially obviates one or more of the problems caused by limitations and disadvantages of the related art.

Another object of the present invention is to provide a nonvolatile ferroelectric memory device having a reduced layout area.

Another object of the present invention is to provide a nonvolatile ferroelectric memory device that increases amplification stability.

Another object of the present invention is to provide a nonvolatile ferroelectric memory device that reduces a layout requirement by sharing a sensing amplifier.

Another object of the present invention is to provide a nonvolatile ferroelectric memory device that increases amplification stability by sharing a sensing amplifier.

To achieve at least these and other objects and advantages in a whole or in part and in accordance with the purpose of the present invention, as embodied and broadly described, a nonvolatile ferroelectric memory device having a plurality of cell arrays formed in a matrix includes a plurality of pull-down sensing amplifiers formed between cell arrays arranged in a vertical direction to correspond to the cell arrays, for pull-down amplifying of a data in a corresponding cell array, and a pull-up amplifier shared by an upper and a lower cell arrays, for selectively pull-up amplifying a data in the upper cell array or data in the lower cell array.

To further achieve the above objects in a whole or in part and in accordance with the purpose of the present invention, as embodied and broadly described, there is provided a memory device having a plurality of cell arrays and a corresponding wordline driver, the improvement including a plurality of pull-down sensing amplifiers between adjacent cell arrays in a column, wherein each of the pull-down sense amplifiers correspond to one of the adjacent cell arrays to pull-down amplify data in the corresponding cell array, and a pull-up sensing amplifier shared by an upper and a lower cell array of the adjacent cell arrays to selectively pull-up and amplify the data in one of the upper cell array and the lower cell array.

To further achieve the above objects in a whole or in part and in accordance with the purpose of the present invention, as embodied and broadly described, there is provided a nonvolatile ferroelectric memory device, including first and second cell arrays arranged in a vertical direction, first and second split wordline drivers that provide a driving signal to a corresponding cell array, a first pull-down amplifier that selectively pulls-down a data in the first cell array, a second pull-down sensing amplifier that selectively pulls-down a data in the second cell array; and a pull-up sensing amplifier shared by the first and the second cell arrays that selectively pulls-up the data in each of the first and second cell arrays.

To further achieve the above objects in a whole or in part and in accordance with the purpose of the present invention, as embodied and broadly described, there is provided a sensing amplifier of a nonvolatile memory device, including a first transistor controlled by a first control signal that switches a first signal, a second transistor controlled by the first control signal that switches a second signal, a third transistor having a control electrode coupled with a first electrode on the second transistor and a second electrode coupled to a second electrode on the first transistor, a fourth transistor having a control electrode coupled with a first electrode on the first transistor and a second electrode coupled with a second electrode on the second transistor, a fifth transistor that has a second electrode coupled with first electrodes of the third and the fourth transistors, and a first electrode coupled with a first reference voltage, wherein the fifth transistor is controlled by a second control signal, a sixth transistor having a first electrode coupled with a second reference voltage and a second electrode coupled with the second electrode of the first transistor, a seventh transistor having a first electrode coupled with the second reference voltage and a second electrode commonly coupled with the second electrode of the second transistor and a control electrode of the sixth transistor, and an eighth transistor that equalizes the second electrodes of the sixth and the seventh transistors, wherein the eighth transistor is controlled by a third control signal.

It is to be understood that both the foregoing general description and the following detailed description are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
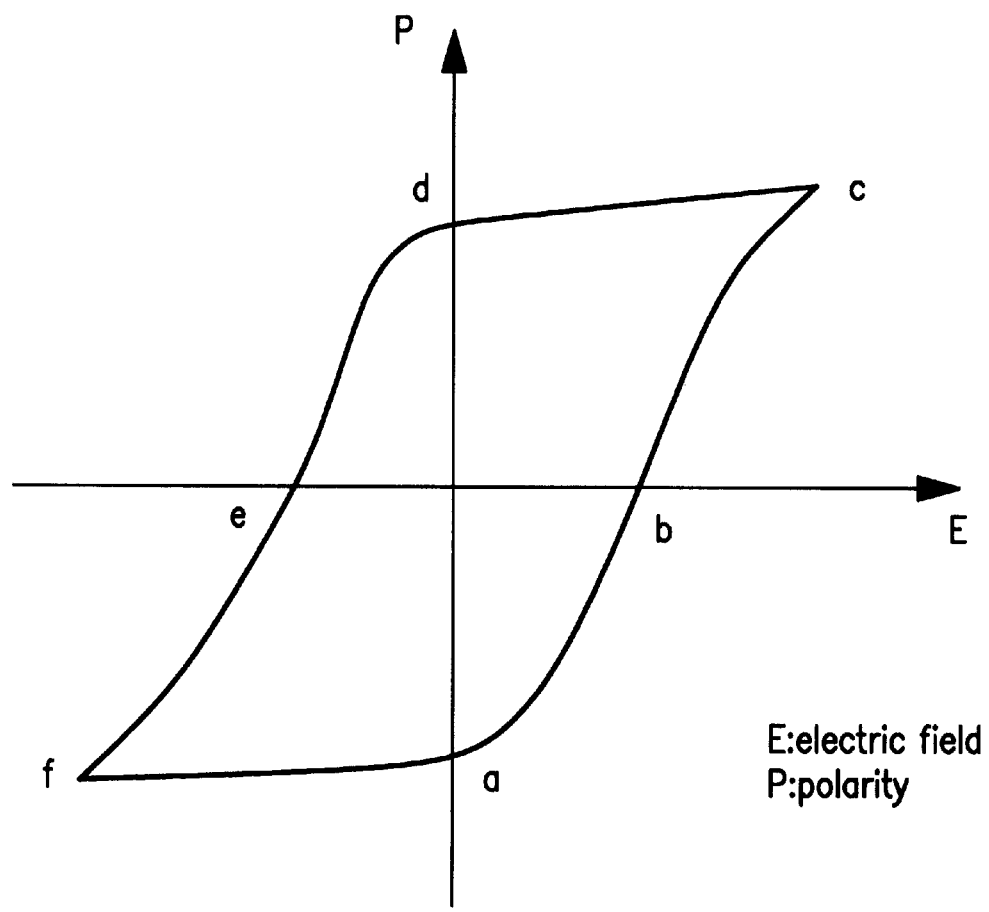
FIG. 1 shows hysteresis loop of a ferroelectric.
Figure 2:
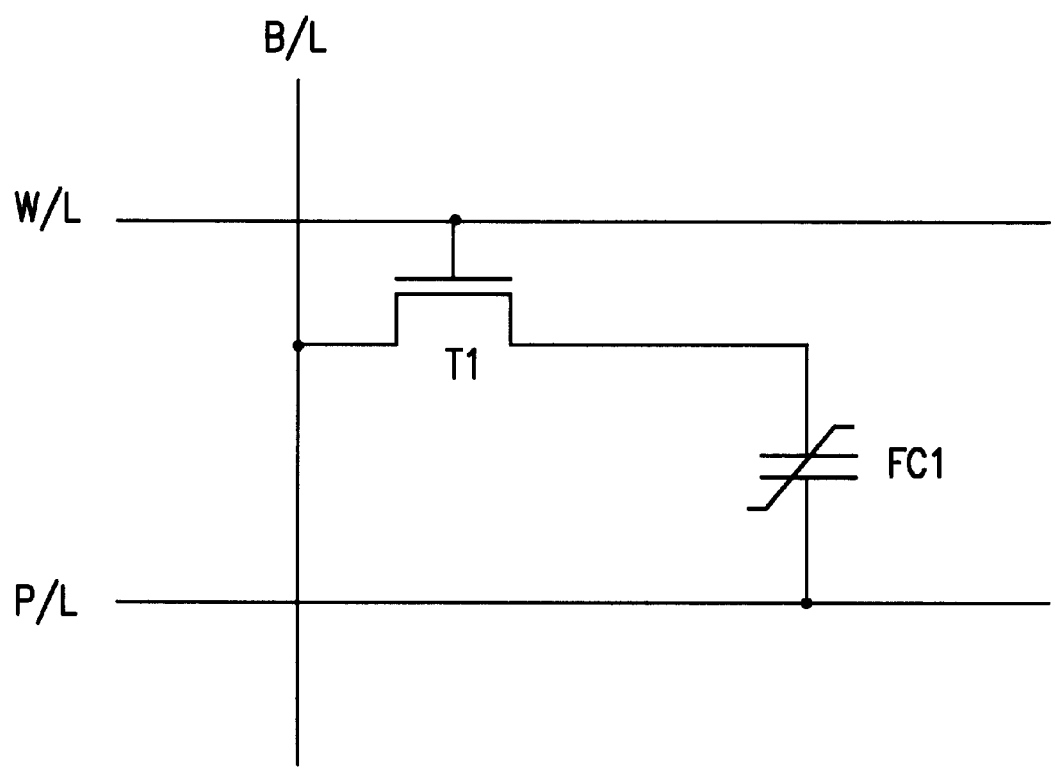
FIG. 2 is a schematic view of a unit cell of a related art nonvolatile ferroelectric memory.
Figure 3A:
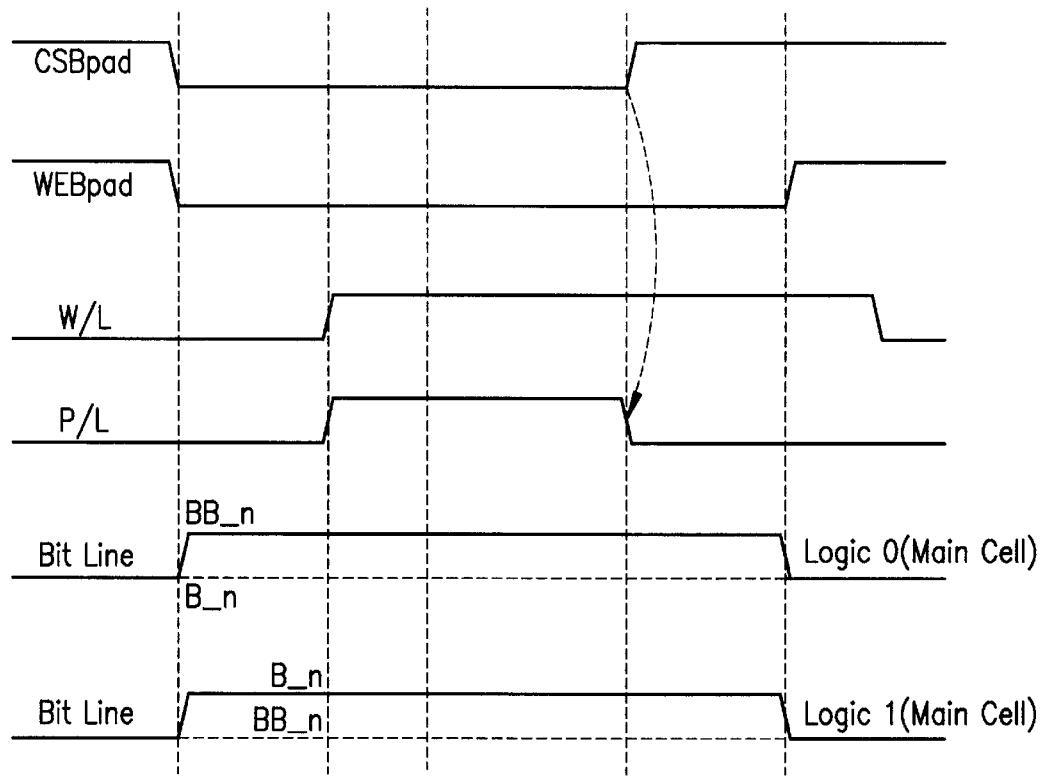
FIG. 3a is a timing chart illustrating the operation of a write mode of the related art nonvolatile ferroelectric memory device.
Figure 3B:
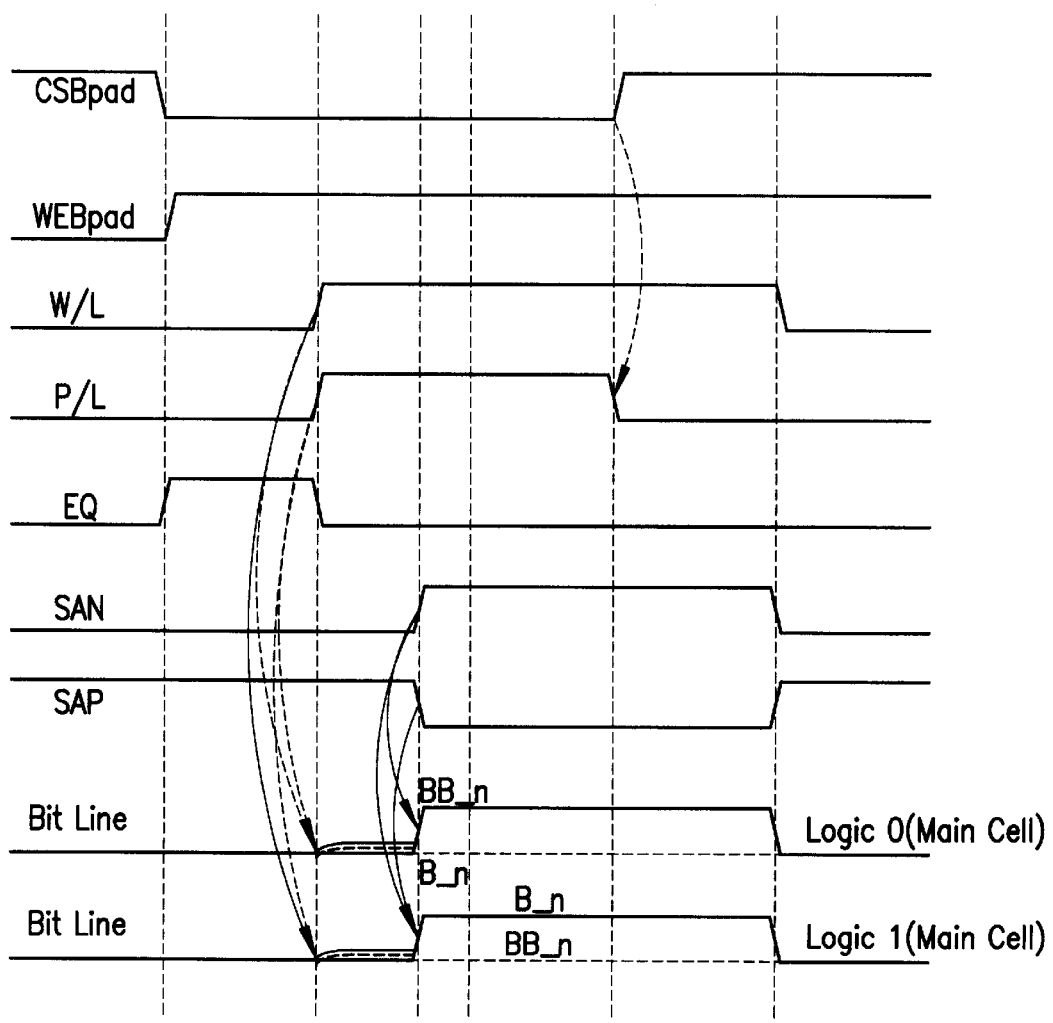
FIG. 3b is a timing chart illustrating the operation of a read mode of the related art nonvolatile ferroelectric memory device.
Figure 4:
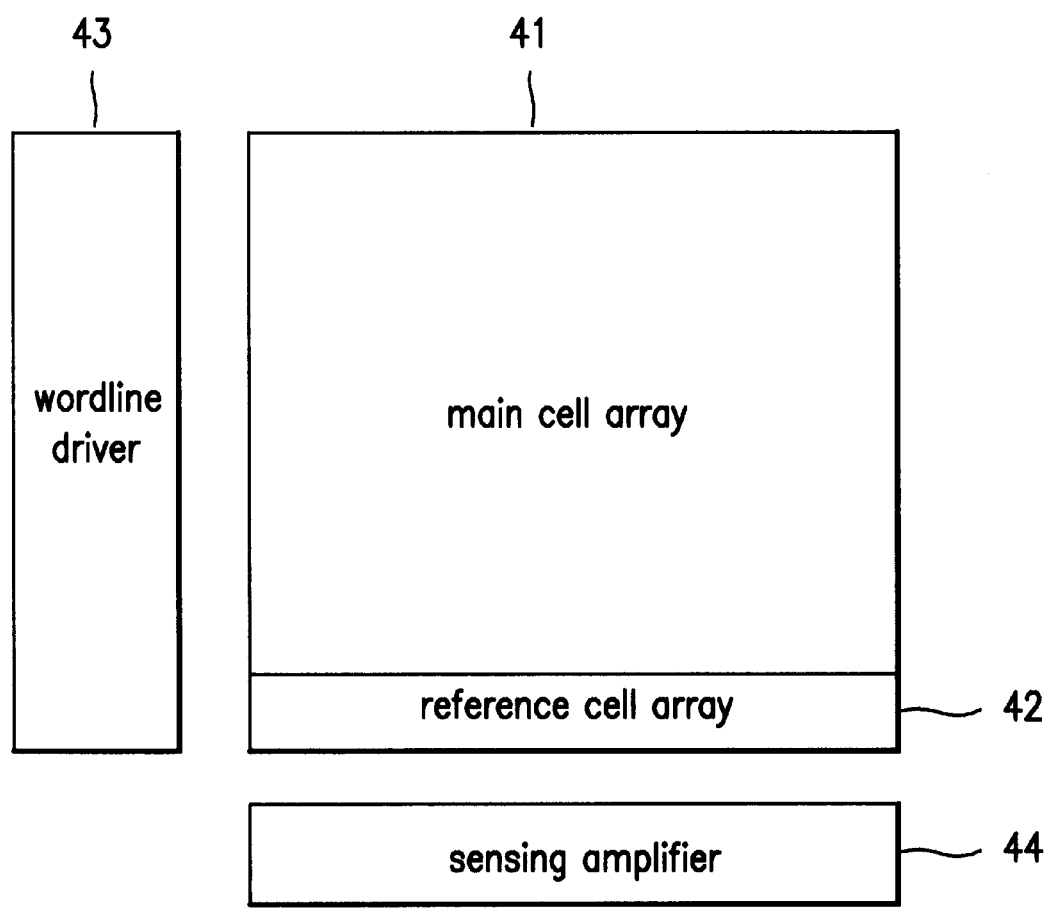
FIG. 4 is a block diagram of the related art nonvolatile ferroelectric memory device.
Figure 5:
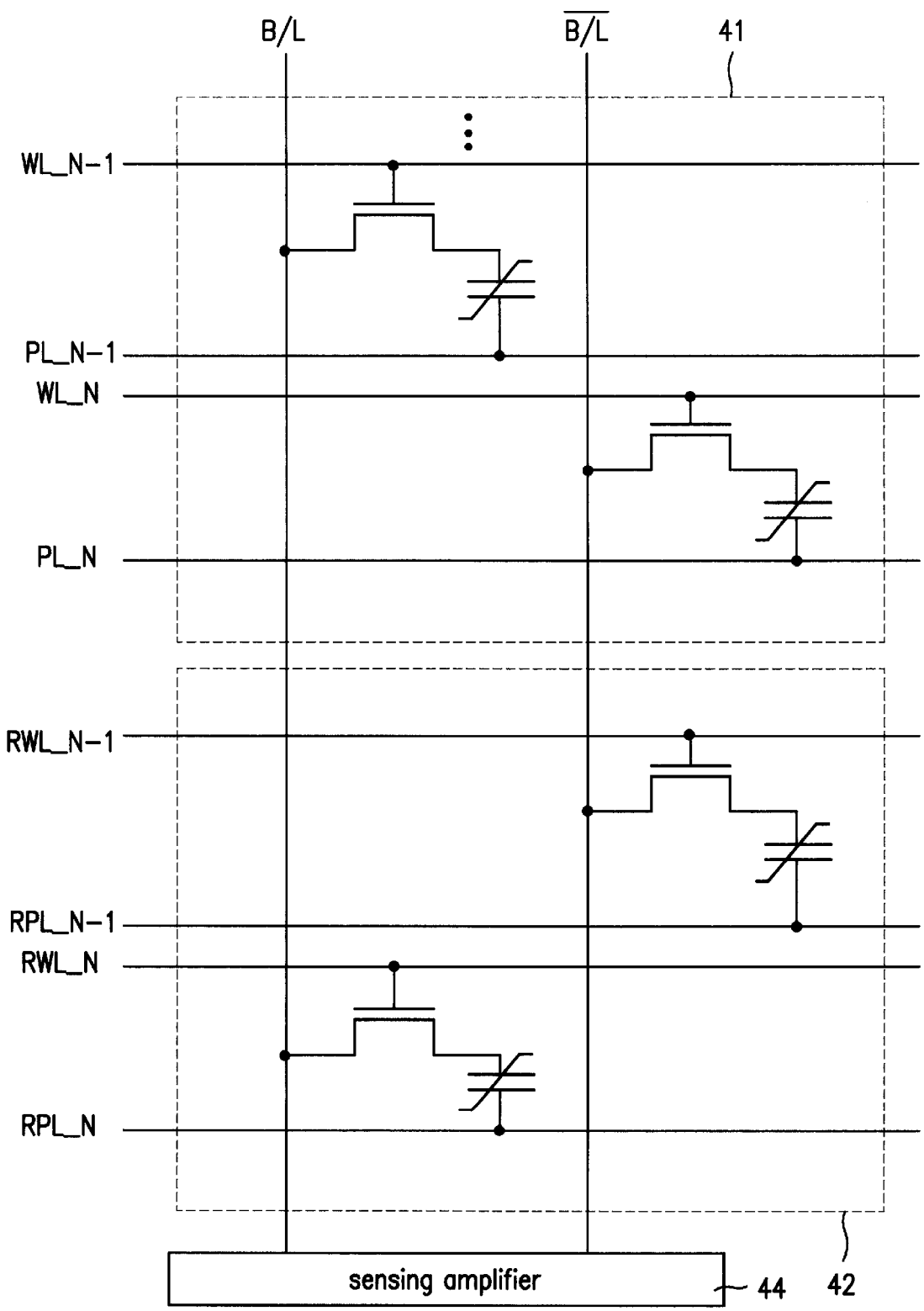
FIG. 5 is a diagram of a partially detailed view of FIG. 4.
Figure 6:
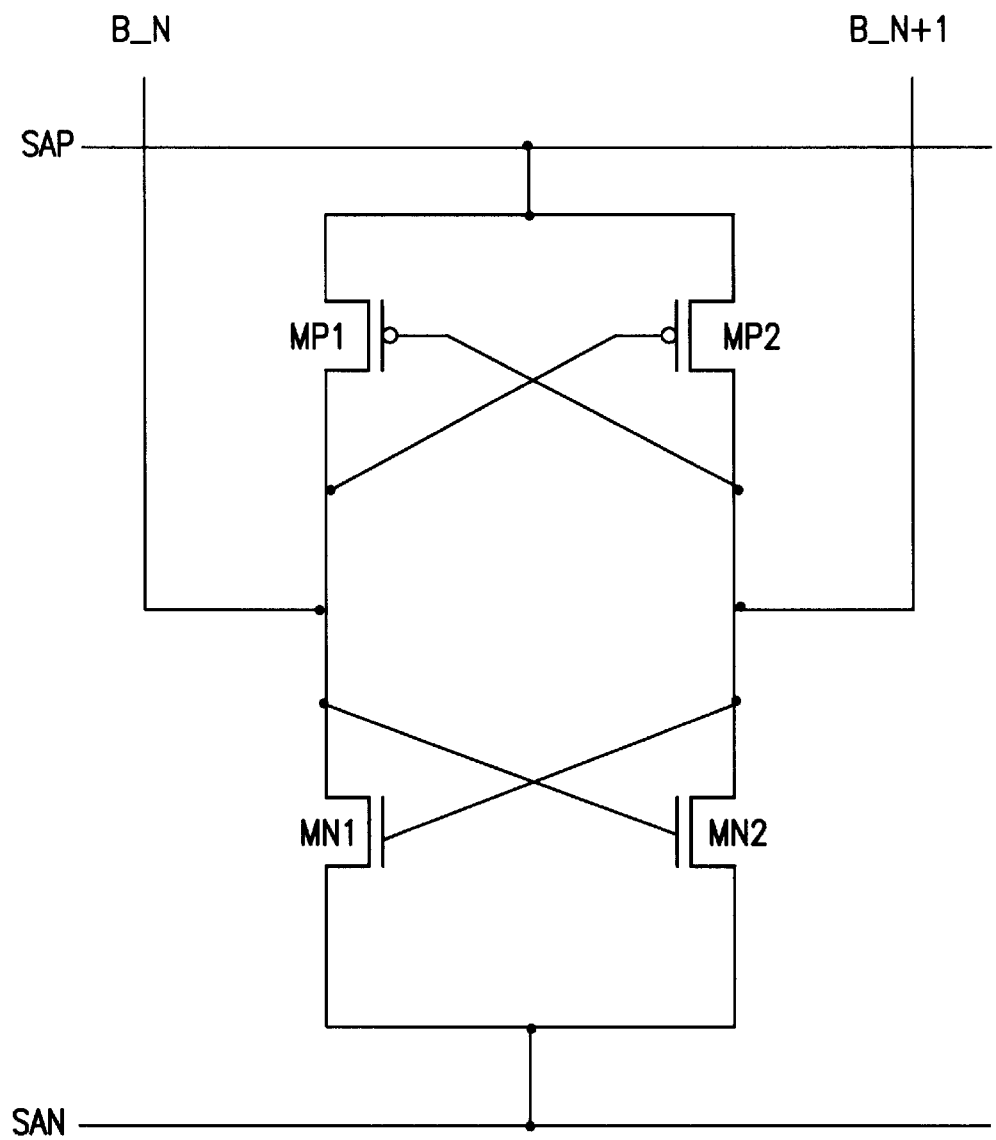
FIG. 6 is a detailed schematic diagram of a sensing amplifier of FIG. 4.
Figure 7:
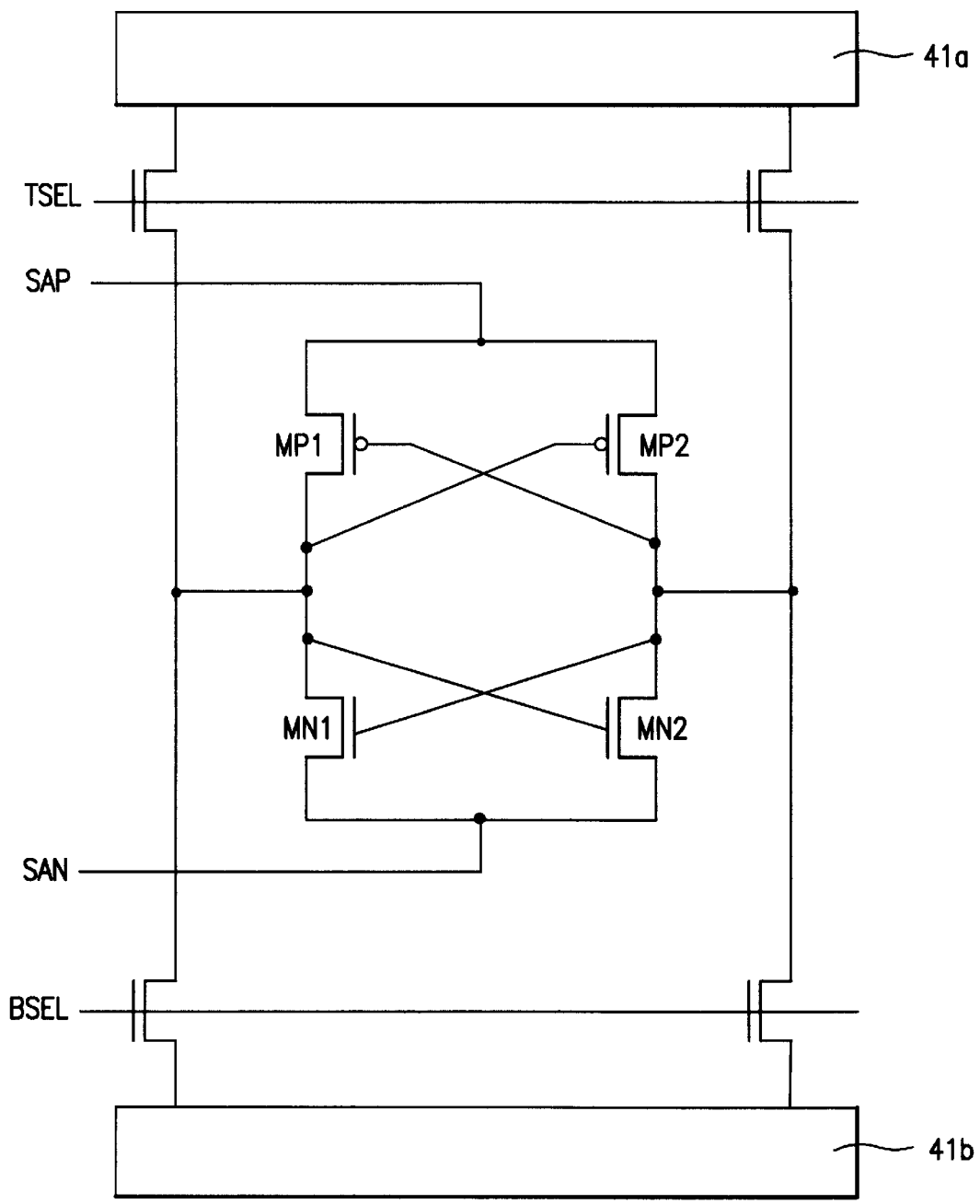
FIG. 7 is a block diagram of a cell array and a sensing amplifier according to the related art nonvolatile ferroelectric memory device.
Figure 8:
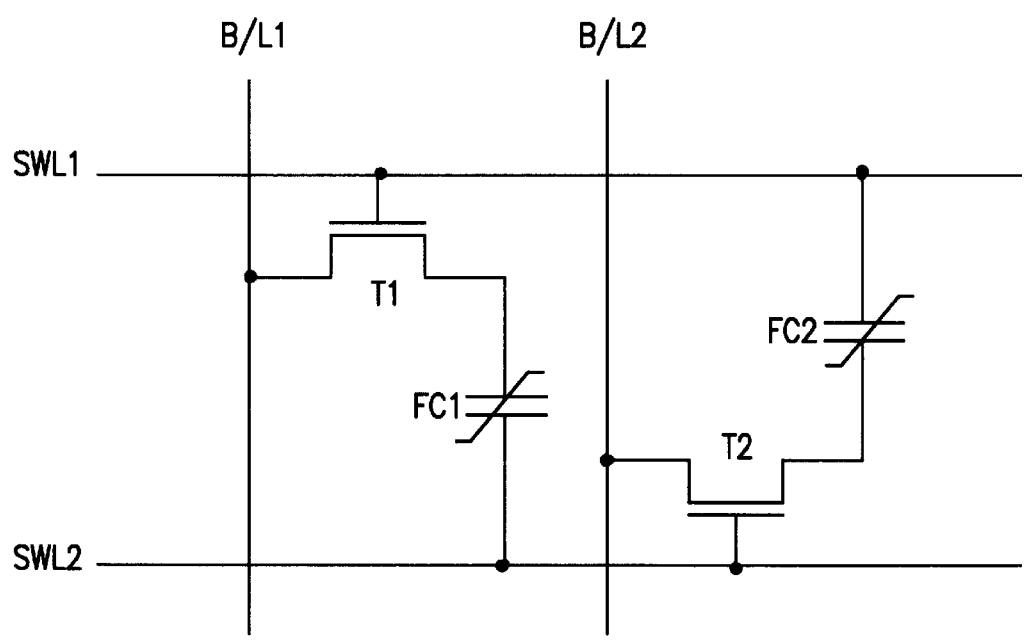
FIG. 8 is a block diagram showing a unit cell of a nonvolatile ferroelectric memory device according to preferred embodiments of the present invention.

FIG. 8 is a schematic view showing a unit cell of a nonvolatile ferroelectric memory device according to preferred embodiments of the present invention. As shown in FIG. 8, a unit cell of the nonvolatile ferroelectric memory device includes first and second split wordlines SWL1 and SWL2 formed with a prescribed interval in a row direction, and first and second bitlines B/L1 and B/L2 formed across the first and second split wordlines SWL1 and SWL2. A first transistor T1 has a gate coupled with the first split wordline SWL1 and drain coupled with the first bitline B/L1. A first ferroelectric capacitor FC1 is coupled between a source of the first transistor T1 and the second split wordline SWL2. A second transistor T2 has a gate coupled with the second split wordline SWL2 and drain coupled with the second bitline B2, and a second ferroelectric capacitor FC2 is coupled between a source of the second transistor T2 and the first split wordline SWL1. A plurality of the unit cells constitute a cell array.

In view of data storage, the unit cell can include a pair of split wordlines, a bitline, a transistor 1T, and a ferroelectric capacitor 1C. The unit cell can also include a pair of split wordlines, two bitlines, two transistors 2T, and two ferroelectric capacitors 2C. In the preferred embodiments according to the present invention, the unit cell of 2T/2C structure is used.

Figure 9:
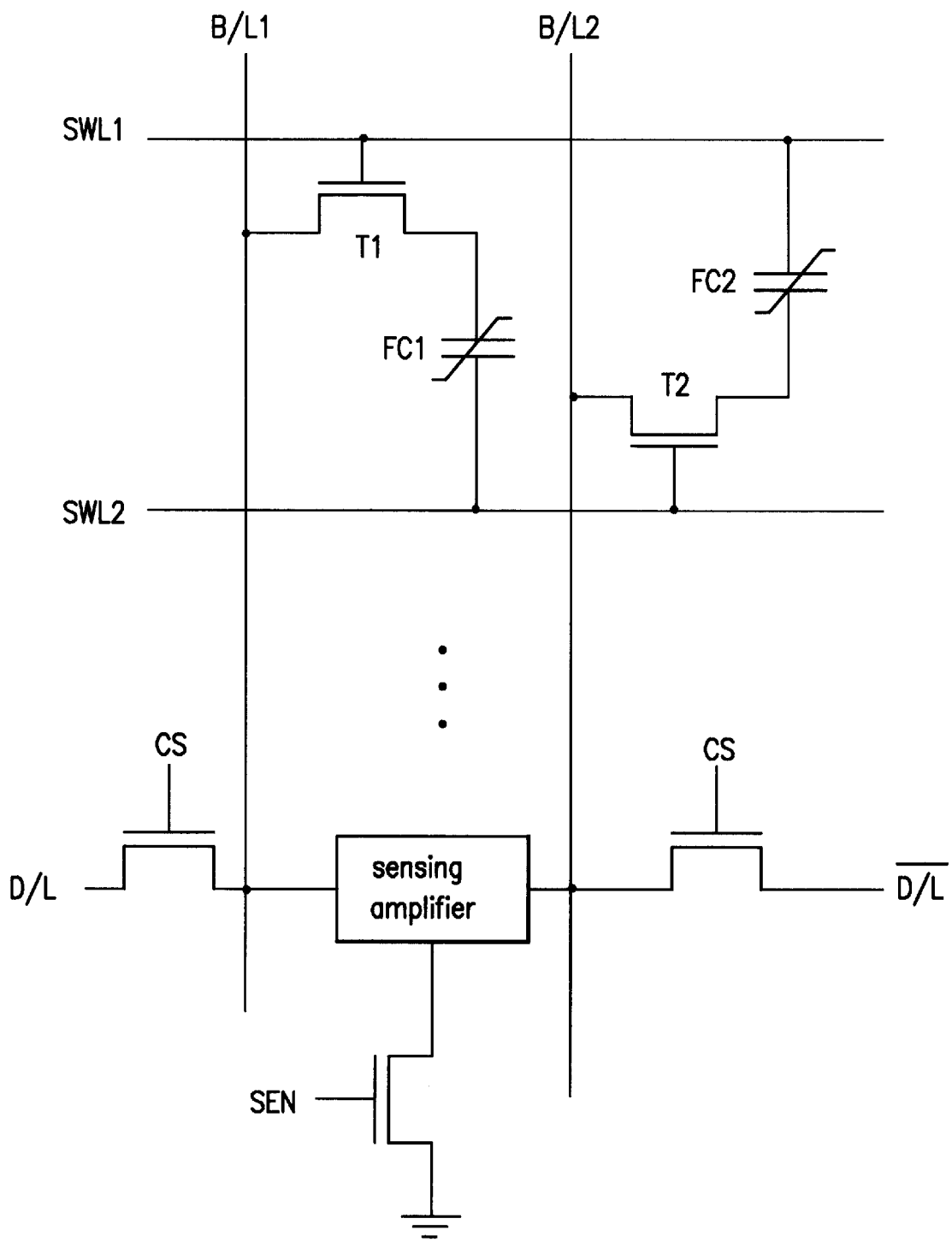
FIG. 9 is a circuit diagram showing a nonvolatile ferroelectric memory device according to the preferred embodiments of present invention.

Operations of the nonvolatile ferroelectric memory device will now be described. FIG. 9 is a circuit diagram showing a nonvolatile ferroelectric memory device according to preferred embodiments of the present invention.

As shown in FIG. 9, a plurality of split wordline pairs including first and second split wordlines SWL1 and SWL2 in pairs are preferably formed in row direction. A plurality of bitlines B/Ln and B/Ln+1 are formed across the split wordline pairs. Sensing amplifiers SA are formed between the respective bitlines to sense data transmitted through the bitlines and transfer the sensed data to a data line DL or a data bar line /DL. At this time, a sensing amplifier enable portion and a selection switching portion are provided (not shown). The sensing amplifier enable portion outputs a sensing amplifier enable signal SEN to enable the sensing amplifiers SA, and the selection switching portion selectively switches bitlines and data lines and can use a column selection signal CS.

Operations of a nonvolatile ferroelectric memory device according to preferred embodiments of the present invention will be described with reference to a timing chart shown in FIG. 10.

Figure 10:
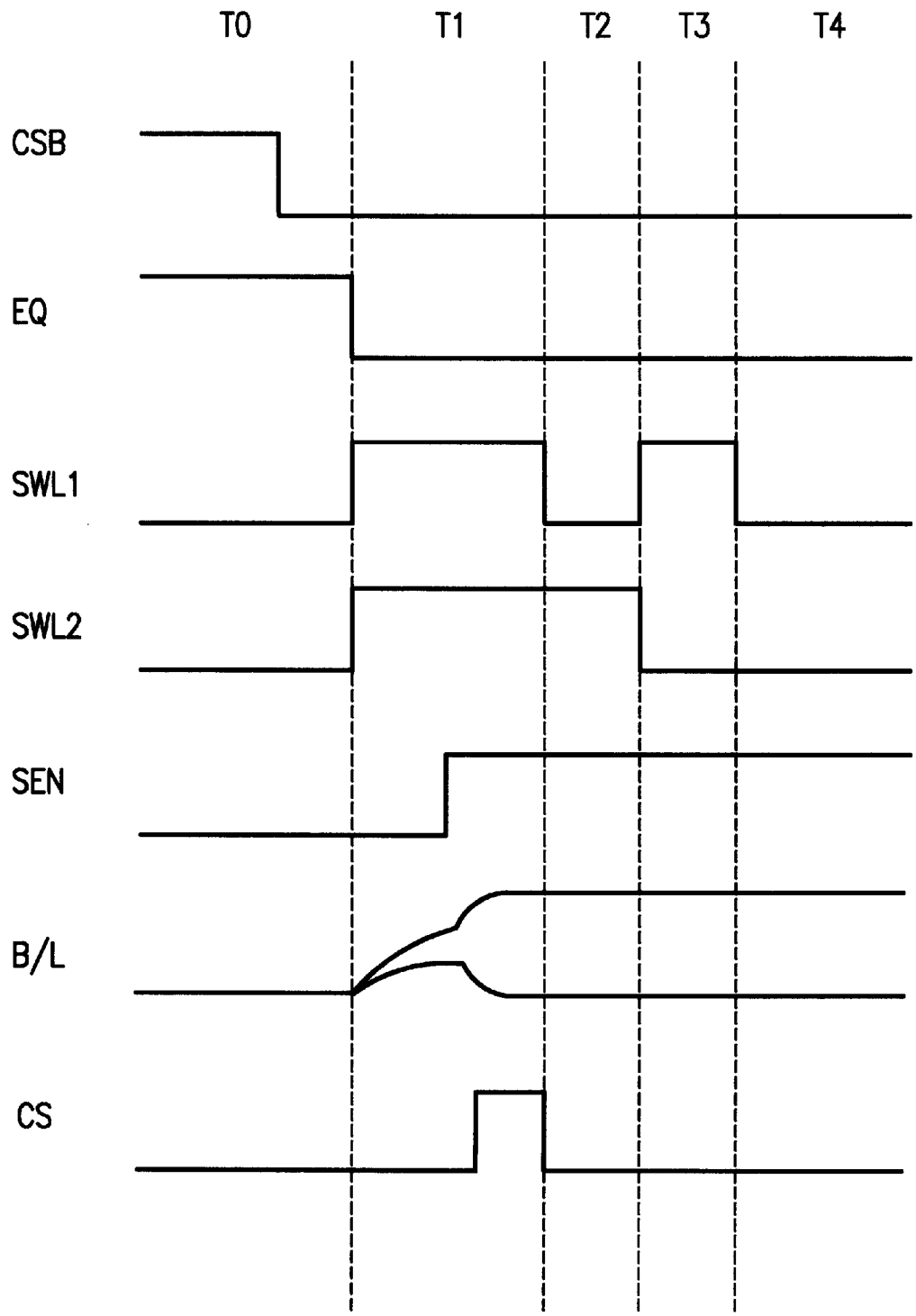
FIG. 10 is a timing diagram showing operations of a nonvolatile ferroelectric memory device in accordance with preferred embodiments of the present invention.

A T0 period in FIG. 10 denotes a period before the first split wordline SWL1 and the second split wordline SWL2 are activated to "high(H)". In this T0 period, all of bitlines are preferably precharged at a threshold voltage level of an NMOS transistor.

A T1 period denotes a period that the first and second split wordlines SWL1 and SWL2 are all to become "H". In this T1 period, data of the ferroelectric capacitor in the main cell are transmitted to the main bitline so that the bitline level is varied.

At this time, in case of the ferroelectric capacitor having a logic value "high", since electric fields having opposite polarities are applied to the bitline and the split wordline, the polarity of the ferroelectric is destroyed so that a large amount of current flows. Thus, a high voltage in the bitline is induced. By contrast, in case of the ferroelectric capacitor having a logic value "low", since electric fields having the same polarities are applied to the bitline and the split wordline, polarity of the ferroelectric is not destroyed so that a small amount of current flows. Thus, a low voltage is induced in the bitline.

If the cell data are loaded in the bitline sufficiently, the sensing amplifier enable signal SEN is transited to high so as to activate the sensing amplifier. As a result, the bitline level is amplified.

Since the logic data "H" of the destroyed cell can not be restored at the state that the first and second split wordlines SWL1 and SWL2 are high, the data can be restored in T2 and T3 periods. Subsequently, in T2 period, the first split wordline SWL1 is transited to low, the second split wordline SWL2 is maintained at high level, and the second transistor T2 is turned on. At this time, if the corresponding bitline is high, high data is transmitted to one electrode of the second ferroelectric capacitor FC2 so that the logic value "1" is restored.

In the T3 period, the first split wordline SWL1 is transited to high, the second split wordline SWL2 is transited to low, and the first transistor T1 is turned on. At this time, if the corresponding bitline is high, high data is transmitted to one electrode of the first ferroelectric capacitor FC1 so that logic value "1" is restored.

Figure 11:
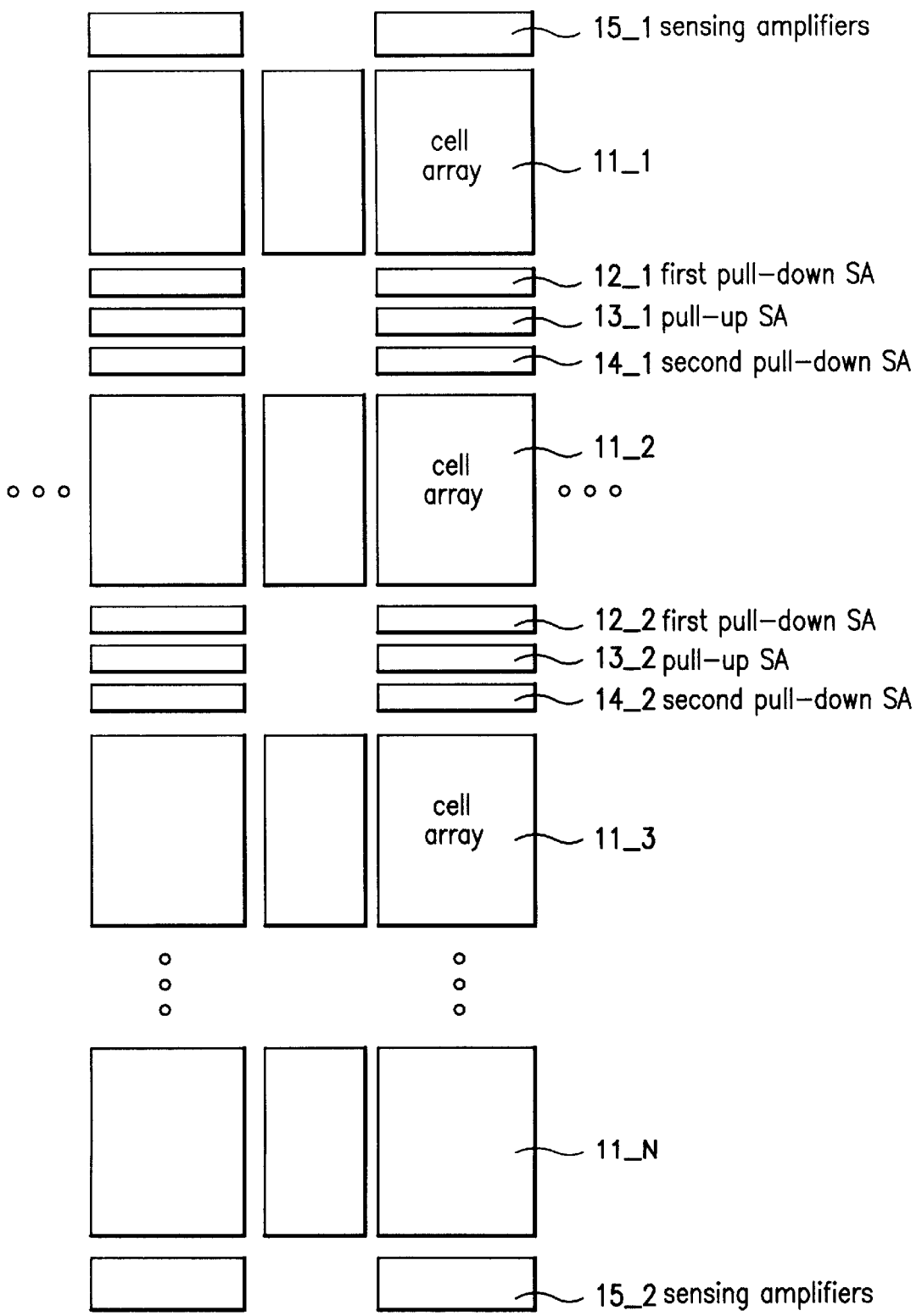
FIG. 11 is a block diagram showing a preferred embodiment of a nonvolatile ferroelectric memory device in accordance with the present invention.

FIG. 11 is a block diagram showing a preferred embodiment of a nonvolatile ferroelectric memory device according to the present invention. As shown in FIG. 11, the preferred embodiment of the nonvolatile ferroelectric memory device according to the present invention includes a plurality of cell arrays 11_1, 11_2 ... 11_N formed in a matrix and first pull-down sensing amplifiers 12_1, 12_2 ... 12_N formed between vertically aligned cell arrays among the plurality of cell arrays for pull-down amplifying of a bit line level of an upper cell array. Second pull-down sensing amplifiers 14_1, 14_2. 14_N are for pull-down amplifying of a bit line level of a lower cell array, and pull-up sensing amplifiers 13_1, 13_2 ... 13_N are for pull-up amplifying of an output of the first pull-down sensing amplifier 12_1, 12_2 ... 12_N or an output of the second pull-down sensing amplifier 14_1, 14_2 ... 14_N.

The sensing amplifiers 15_1 and 15_2 for sensing data in a cell array at an outer most position in a vertical direction have a system in which any one of the first pull-down amplifiers and the second pull-down amplifiers are combined with the pull-up sensing amplifier. That is, any one of the two pulldown sensing amplifiers is coupled to the pull-up sensing amplifier to form the sensing amplifiers 15_1 and 15_2 for sensing the data in the outer most position of the cell array.

In this instance, the first pull-down amplifiers 12_1, 12_2 ... 12_N and the second pull-down sensing amplifiers 14_1, 14_2 ... 14_N preferably have the same system, except that an input terminal of the first pull-down sensing amplifiers 12_1, 12_2 ... 12_N is coupled with the bit line in the upper cell array, while an input terminal of the second pull-down sensing amplifiers 14_1, 14_2 ... 14_N is coupled to the bit line in the lower cell array. However, the present invention is not intended to be so limited. The output terminals on the first and second pull-down sensing amplifiers are commonly coupled with an input terminal of the pull-up sensing amplifier 13_1, 13_2 ... 13_N.

Accordingly, the first pull-down sensing amplifiers 12_1, 12_2 ... 12_N and the pull-up sensing amplifiers 13_1, 13_2 ... 13_N are preferably simultaneously activated. Also, the second pull-down sensing amplifiers 14_1, 14_2 ... 14_N and the pull-up sensing amplifiers 13_1, 13_2 ... 13_N are preferably simultaneously activated.

However, if the first pull-down sensing amplifiers and the pull-up sensing amplifiers are active, the second pull-down sensing amplifiers are maintained inactive. Likewise, if the second pull-down sensing amplifiers and the pull-up sensing amplifiers are active, the first pull-down amplifiers are maintained inactive.

Figure 12:
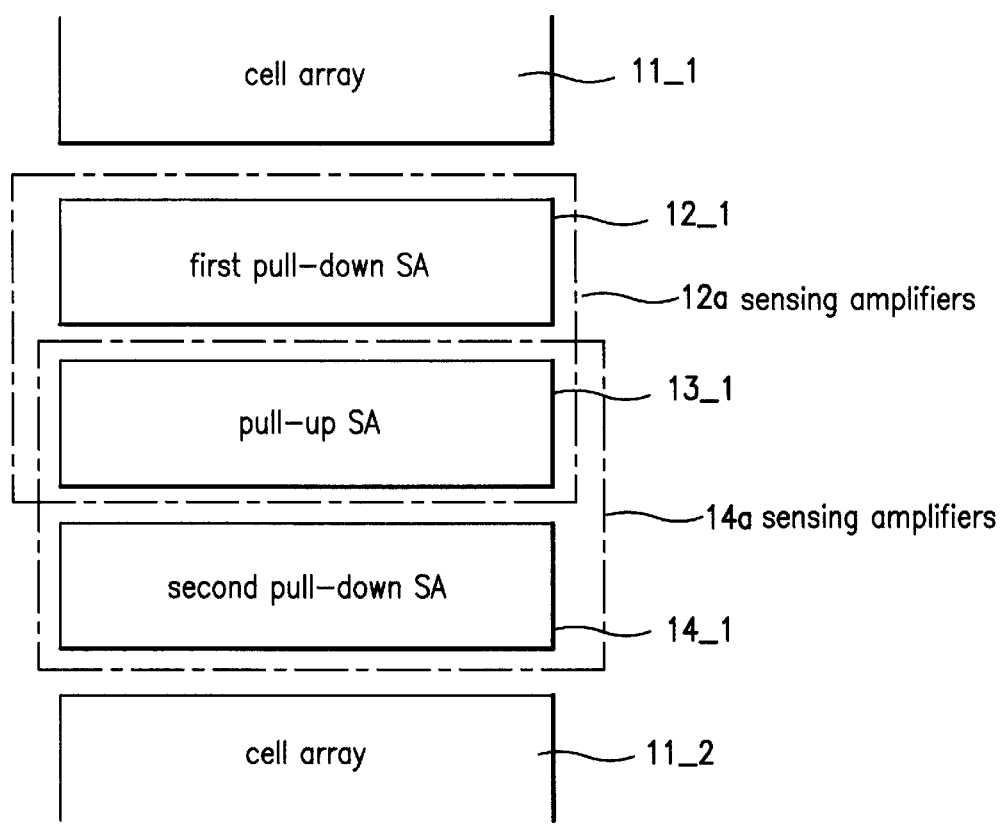
FIG. 12 is a diagram showing a partially enlarged view of FIG. 11.

FIG. 12 is a block diagram showing the first and second pull-down sensing amplifiers and the pull-up sensing amplifier in the preferred embodiment of the nonvolatile ferroelectric memory device in accordance with the present invention. As shown in FIG. 12, a pull-down sensing amplifier 12_1 and a pull-up sensing amplifier 13_1 are combined to form a complete sensing amplifier 12a, and the second pull-down sensing amplifier 14_1 and the pull-up sensing amplifier 13_1 are combined to form another complete sensing amplifier 14a. It is again noted here that the pull-up sensing amplifier 13_1 is commonly used for each pull-down sensing amplifier.

In the preferred embodiment of the nonvolatile ferroelectric memory device according to the present invention, to sense and amplify data of the upper cell array 11_1, the first pull-down sensing amplifier 12_1 and the pull-up sensing amplifier 13_1 are preferably activated, and the second pull-down sensing amplifier 14_1 is not activated. When the first pulldown sensing amplifier 12_1 and the pull-up sensing amplifier 13_1 are activated, if the bit line level of the upper cell array 11_1 is below a reference level, the first pull-down sensing amplifier 12_1 conducts pull-down amplification. If the bit line level of the upper cell array 11_1 is above the reference level, the pull-up sensing amplifier 13_1 pull-up amplifies the output of the first pull-down sensing amplifier 12_1.

To sense and amplify data of the lower cell array 11_2, the second pull-down sensing amplifier 14_1 and the pull-up sensing amplifier 13_1 are activated, and the first pull-down sensing amplifier 12_1 is not activated When the second pull-down sensing 14_1 and the pull-up sensing amplifier 13_1 are activated, if the bit line level of the lower cell array 11_2 is below a reference level, the second sensing amplifier 14_1 conducts pull-down amplification. If the bit line level is above the reference level, the pull-up sensing amplifier 13_1 pull-up amplifies the output of the second pull-down amplifier 14-1.

Figure 13:
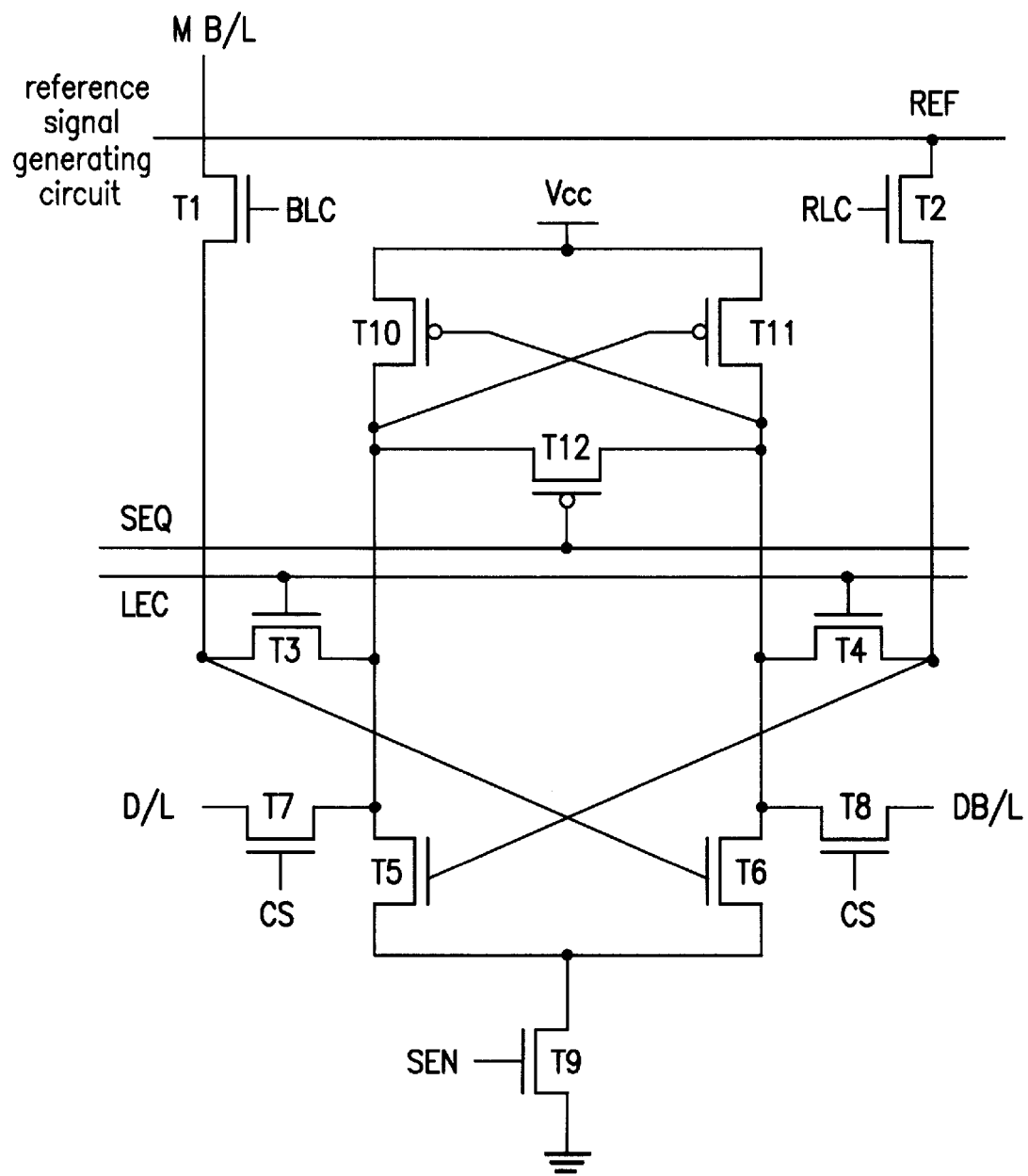
FIG. 13 is a block diagram of a preferred embodiment of a sensing amplifier of the nonvolatile ferroelectric memory device in accordance with the present invention.

A sensing amplifier at an outer most position has one pull-down sensing amplifier and one pull-up sensing amplifier in the preferred embodiment of the nonvolatile ferroelectric memory according to the present invention. FIG. 13 is a block diagram of a preferred embodiment of a sensing amplifier for sensing data in the outer most cell array in the nonvolatile ferroelectric memory device according to the present invention, showing a sensing amplifier.

As shown in FIG. 13, the preferred embodiment of the sensing amplifier in the nonvolatile ferroelectric memory device includes a first transistor T1 for switching a signal loaded on the bit line, a second transistor T2 for switching a reference signal from a reference signal generating circuit (not shown), a third transistor T3 for switching a signal from the bit line provided through the first transistor T1, and a fourth transistor T4 for switching a reference signal provided through the second transistor T2. A fifth transistor T5 has a gate coupled with an input terminal on the fourth transistor T4 and a drain coupled to an output terminal on the third transistor T3. A sixth transistor T6 has a gate coupled to an input terminal of the third transistor T3 and a drain coupled with an output terminal of the fourth transistor T4. A seventh transistor T7 is coupled between an output terminal on the fifth transistor T5 and a data line D/L, and controlled by a column selection signal CS, and an eighth transistor T8 is coupled between an output terminal on the sixth transistor T6 and a data bar line DB/L, and controlled by the column selection signal CS. A ninth transistor T9 has a source coupled to a ground terminal and a drain coupled together with sources of the fifth and sixth transistors T5 and T6. A tenth transistor T10 has a source coupled to a power source voltage terminal Vcc and a drain coupled with an output terminal on the third transistor T3, and an eleventh transistor T11 has a source coupled to the power source voltage terminal and a drain connected both to an output terminal on the fourth transistor T4 and a gate of the tenth transistor T0. A gate of the eleventh transistor T11 is coupled with a drain of the tenth transistor T10. A twelfth transistor T12 equalizes drains of the tenth transistor T10 and the eleventh transistor T11.

The first transistor T1 is preferably controlled by a bitline control signal BLC, and the second transistor T2 is preferably controlled by a reference bitline control signal RLC. The third and fourth transistors T3 and T4 are controlled by a latch enable control signal LEC. The ninth transistor T9 is controlled by a sensing amplifier active signal SEN. The twelfth transistor T12 is controlled by a sensing amplifier equalizing signal SEQ.

Figure 14:
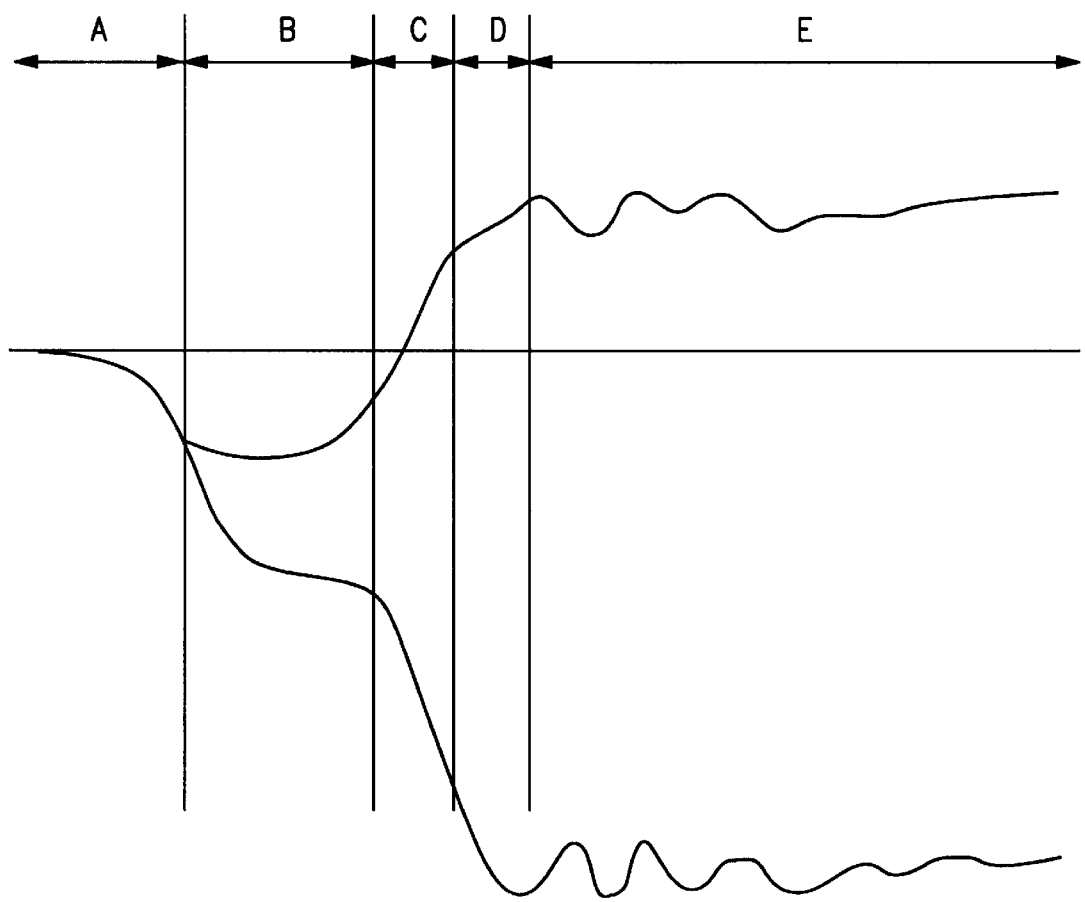
FIG. 14 is a diagram that shows variation of waveforms at an output node of the sensing amplifier illustrated in FIG. 13.

FIG. 14 is a diagram that shows variation of waveforms at nodes SN3 and SN4 of the sensing amplifier illustrated in FIG. 13. 'A' represents a precharge period, 'B' represents an amplification period, 'C' represents a pseudo latch period, 'D' represents an actual latch period, and 'E' represents an output period.

Figure 15:
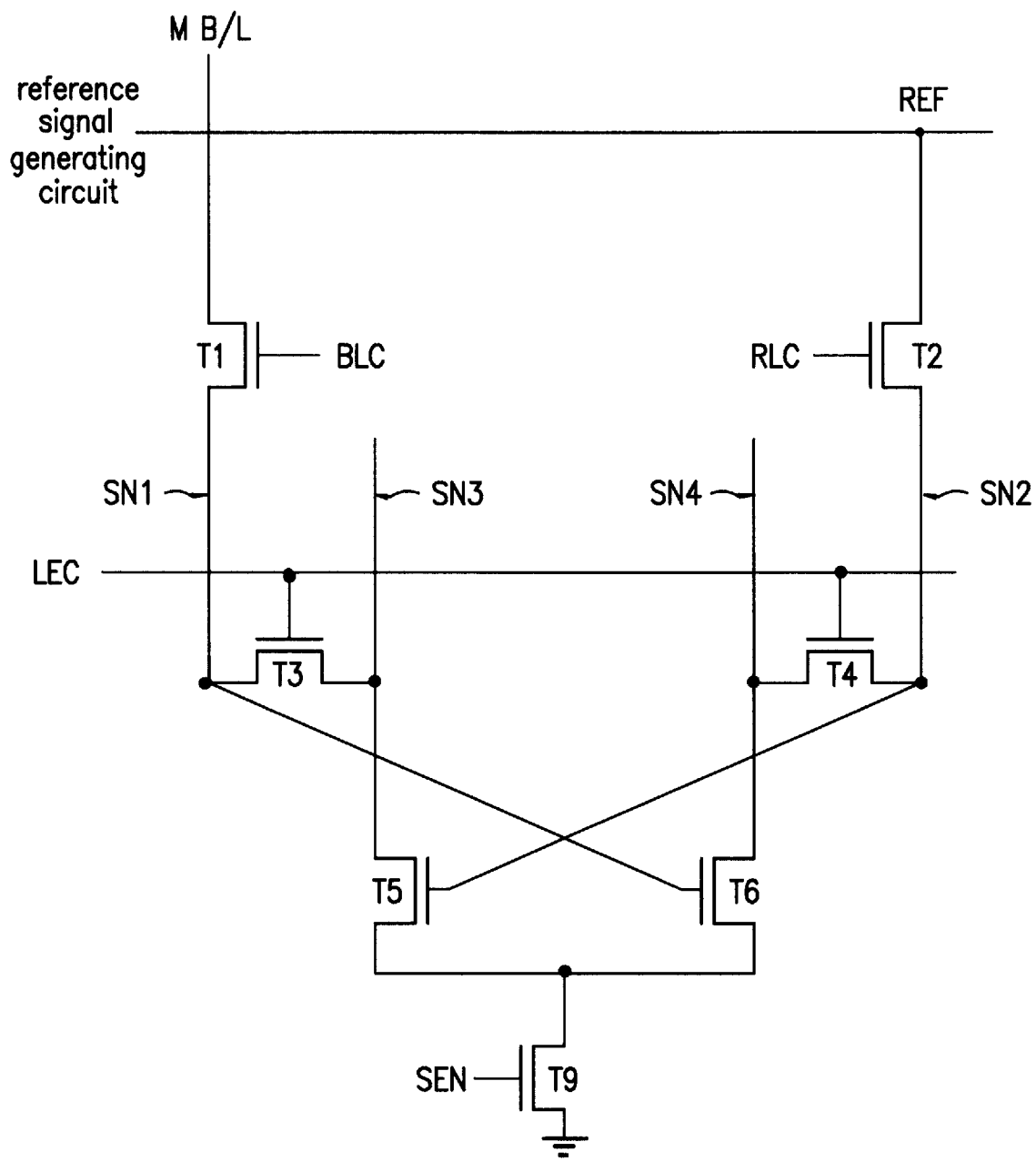
FIG. 15 is a block diagram of a preferred embodiment of a pull-down sensing amplifier of the nonvolatile ferroelectric memory device in accordance with the present invention.

FIG. 15 is a block diagram of a preferred embodiment of a pull-down sensing amplifier of the nonvolatile ferroelectric memory device in accordance with the present invention. It is noted that the preferred embodiment of the pull-down sensing amplifier shown in FIG. 15 can be used in the preferred embodiment of the sensing amplifier shown in FIG. 13. However, the present invention is not intended to be so limited.

The pull-down sensing amplifier shown in FIG. 15 includes a first transistor T1 for switching a signal from the main bit line M B/L, a second transistor T2 for switching a reference signal REF, a third transistor T3 for switching the signal from the main bit line M B/L received through the first transistor T1, a fourth transistor T4 for switching the reference signal REF received through the second transistor T2. A fifth transistor T5 has a gate coupled with an input terminal on the fourth transistor T4 and a drain coupled with an output terminal on the third transistor T3. A sixth transistor T6 has a gate coupled with an input terminal on the third transistor T3 and a drain coupled with an output terminal on the fourth transistor T4. A ninth transistor T9 has a source coupled to a ground terminal and a drain coupled with drains of fifth and sixth transistors T5 and T6.

When a sensing amplifier enable signal SEN provided to the gate of the ninth transistor T9 is transited to a high level, an amplification operation occurs by the fifth transistor T5 having the gate for receiving the reference signal REF and the sixth transistor T6 having the gate for receiving the signal from the main bit line M B/L. The output is then provided to nodes SN3 and SN4, and, then, to nodes SN1 and SN2 in response to a latch enable control signal LEC. That is, the output is provided to the cell bitline through the first and second transistors T1 and T2 in response to a bitline control signal BLC.

Figure 16:
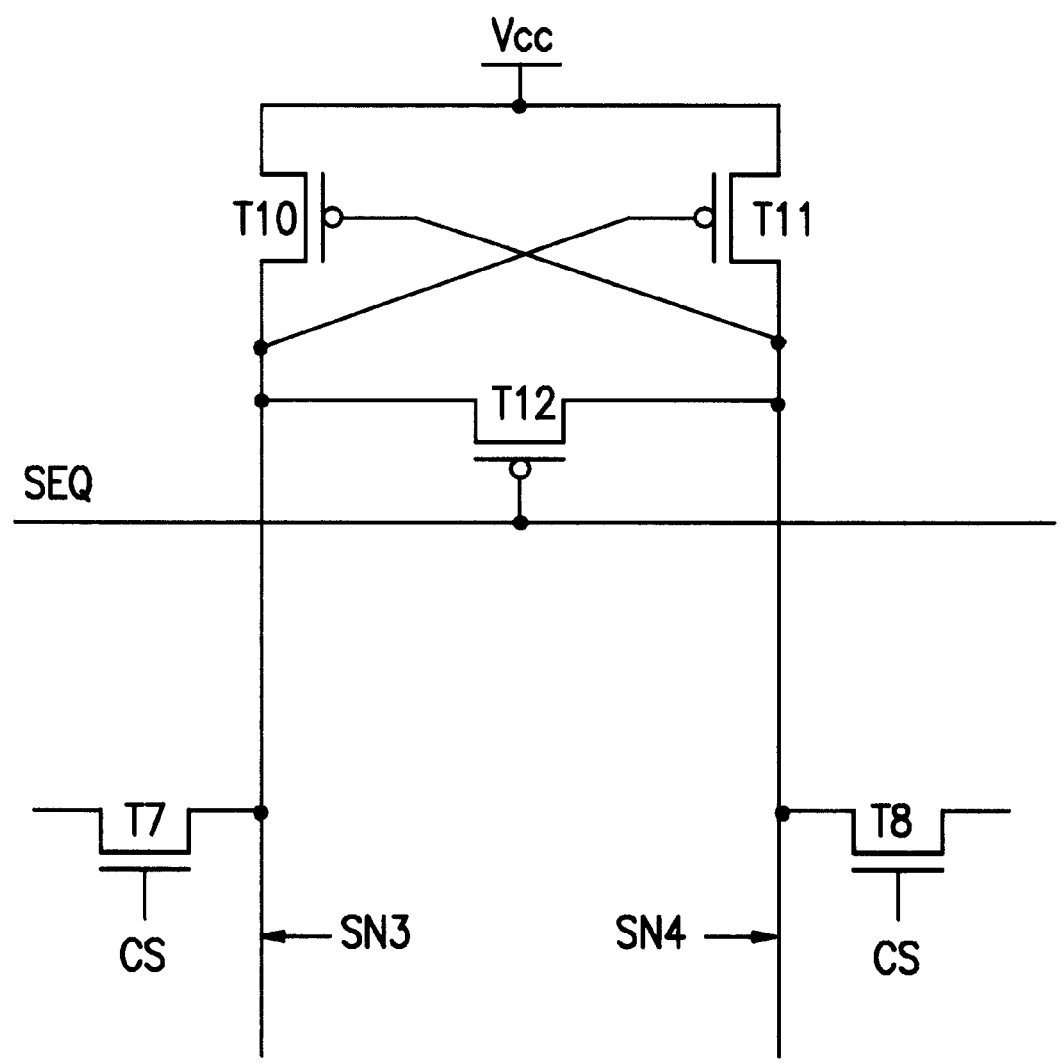
FIG. 16 is a block diagram of a preferred embodiment of a pull-up sensing amplifier of the nonvolatile ferroelectric memory device in accordance with the present invention.

FIG. 16 is a diagram that shows a block diagram of a preferred embodiment of a pull-up sensing amplifier of the nonvolatile ferroelectric memory device in accordance with the present invention. It is noted that the preferred embodiment of the pull-up sensing amplifier shown in FIG. 16 can be used in the preferred embodiment of the sensing amplifier shown in FIG. 13. However, the present invention is not intended to be so limited.

The pull-up sensing amplifier shown in FIG. 16 pull-up amplifies a signal from the bitline provided through nodes SN3 and SN4. The node SN3 is an output terminal on the third transistor T3, and the node SN4 is an output terminal on the fourth transistor T4.

As the third and fourth transistors T3 and T4 are preferably devices in the pull-down sensing amplifier, it can be said that the pull-up sensing amplifier pull-up amplifies a signal from the bit line provided through the pull-down sensing amplifier, eventually.

The pull-up sensing amplifier shown in FIG. 16 includes two PMOS transistors T10 and T11 having drains coupled with nodes SN3 and SN4, respectively, to which a signal from the bit line is provided from the pull-down sensing amplifier, and sources coupled with a power source terminal Vcc. Another PMOS transistor T12 can equalize the drains of the PMOS transistors T10 and T11, and two NMOS transistors T7 and T8 selectively transfer the pull-up amplified signal preferably to a data line and a data bar line.

That is, if a data on the bit line is above a level of a reference signal, the pull-up sensing amplifier pull-up amplifies the bit line signal transferred through third and fourth transistors T3 and T4 in the pulldown sensing amplifier. This process is in a read mode. On the other hand, if the data on the data line and the data bar line are above the level of the reference signal in a write mode, the bitline signal is pull-up amplified at the pull-up sensing amplifier, passed through nodes SN3 and SN4, and provided to the bitline through third and fourth transistors T3 and T4, and the first and second transistors T1 and T2 in the pull-down sensing amplifier.

In the preferred embodiment of the pull-up sensing amplifier, the twelfth transistor T12, not only serves for equalizing the nodes SN3 and SN4, but also prevents the pull-up sensing amplifier from being changed to a latch mode, even though a signal induced to the nodes SN3 and SN4 is amplified by the pulldown sensing amplifier. Accordingly, an amplification can occur whenever the input changes. Therefore, the twelfth transistor T12 can be held in an turned-on state throughout the precharge period and the amplification period of the initial sensing amplifier.

As described above, preferred embodiments of the non-volatile ferroelectric memory device according to the present invention various advantages. Division of the sensing amplifiers into the pull-down sense amplifier and the pull-up sense amplifier, with the pull-up sensing amplifier shared by the upper and lower cell arrays arranged in a vertical direction, permits a reduction or minimization of an area occupied by the sensing amplifiers. Thus, the preferred embodiment of the nonvolatile ferroelectric memory device facilitate an effective reduction of the layout and secures stability following amplification.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A memory device having a plurality of cell arrays and a corresponding wordline driver, the improvement comprising:

a plurality of pull-down sensing amplifiers between adjacent cell arrays in a column, wherein each of the pull-down sense amplifiers correspond to one of the adjacent cell arrays to pull-down amplify data in the corresponding cell array; and a pull-up sensing amplifier shared by an upper and a lower cell array of the adjacent cell arrays to selectively pull-up and amplify the data in one of the upper cell array and the lower cell array.

2. The memory device of claim 1, wherein a sensing amplifier for sensing data in an outer most position of the column of cell array includes a combination of one pull-down sensing amplifier and the pull-up sensing amplifier.

3. The memory device of claim 1, wherein among the pull-down sensing amplifiers between the adjacent cell arrays, a selected one of the pull-down sensing amplifiers and the pull-up sensing amplifier that correspond to the upper cell array are concurrently activated, and wherein among the pull-down sensing amplifiers between the adjacent cell arrays, a selected one of the pull-down amplifiers and the pull-up sensing amplifier that correspond to the lower cell array are concurrently activated.

4. The memory device of claim 1, wherein one of the pull-down sensing amplifiers comprises:

a first transistor that switches a first signal;

a second transistor that switches a reference signal;

a third transistor controlled by a first control signal that switches a signal from the first transistor;

a fourth transistor controlled by the first control signal that switches a signal from the second transistor;

a fifth transistor having a control electrode coupled with a first electrode on the fourth transistor and a second electrode coupled to a second electrode on the third transistor;

a sixth transistor having a control electrode coupled with a first electrode on the third transistor and a second electrode coupled with a second electrode on the fourth transistor; and a seventh transistor that has a second electrode coupled with first electrodes of the fifth and the sixth transistors, and a first electrode coupled with a first reference voltage, wherein the seventh transistor is controlled by a third control signal.

5. The memory device of claim 1, wherein the pull-up sensing amplifier comprises:

a first transistor having a first electrode coupled to a data line that is controlled by a selection control signal;

a second transistor having a first electrode coupled to a data bar line, wherein the second transistor is controlled by the selection control signal;

a third transistor having a first electrode coupled with a second reference voltage and a second electrode coupled with a second electrode of the first transistor;

a fourth transistor having a first electrode coupled with the second reference voltage and a second electrode commonly coupled with a second electrode of the second transistor and a control electrode of the third transistor, wherein a control electrode of the fourth transistor is coupled to the second electrode of the third transistor; and a fifth transistor that equalizes the second electrodes of the third and the fourth transistors.

6. A nonvolatile ferroelectric memory device, comprising:

first and second cell arrays arranged in a vertical direction;

first and second split wordline drivers that provide a driving signal to a corresponding cell array;

a first pull-down sensing amplifier that selectively pulls-down a data in the first cell array;

a second pull-down sensing amplifier that selectively pulls-down a data in the second cell array; and, a pull-up sensing amplifier shared by the first and the second cell arrays that selectively pulls-up the data in each of the first and second cell arrays.

7. The nonvolatile ferroelectric memory device of claim 6, wherein one of the first and the second pull-down sensing amplifiers is concurrently activated with the pull-up sensing amplifier.

8. The nonvolatile ferroelectric memory device of claim 6, wherein when the first pull-down sensing amplifier and the pull-up sensing amplifier are activated, if a bit line level of the first cell array is above a reference level, the pull-up sensing amplifier pull-up amplifies an output of the first pull-down sensing amplifier, and wherein if the bit line level is below the reference level, the first pull-down sensing amplifier pull-down amplifies an output of the bit line level of the first cell array.

9. The nonvolatile ferroelectric memory device of claim 6, wherein when the second pull-down sensing amplifier and the pull-up sensing amplifier are activated, if a bit line level of the second cell array is above a reference level, the pull-up sensing amplifier pull-up amplifies an output of the second pull-down sensing amplifier, and wherein if the bit line level is below the reference level, the second pull-down sensing amplifier pull-down amplifies an output of the bit line level of the second cell array.

10. The nonvolatile ferroelectric memory device of claim 9, wherein the pull-up sensing amplifier pull-up amplifies a bit line signal received through the second pull-down sensing amplifier, and wherein the sensing amplifiers are between the first and second cell arrays.

11. The nonvolatile ferroelectric memory device of claim 6, wherein the first and second pull-down sensing amplifiers have an identical system.

12. The nonvolatile ferroelectric memory device of claim 6, wherein a plurality of the first and the second cell arrays are formed in a matrix.

13. The nonvolatile ferroelectric memory device of claim 12, wherein a sensing amplifier that senses a data in the cell array at an outer most position among the plurality of the first and second cell arrays includes a combination of one of the first and second pull-down sensing amplifiers and the pull-up sensing amplifier, and wherein the outer most position is above a top first cell array in a column determined by the vertical direction and below a bottom second cell array in the column.

14. The nonvolatile memory device of claim 6, wherein one of the sensing amplifiers comprises:
   a first transistor that switches a first signal;
   a second transistor that switches a reference signal;
   a third transistor controlled by a first control signal that switches a signal from the first transistor;
   a fourth transistor controlled by the first control signal that switches a signal from the second transistor;
   a fifth transistor having a control electrode coupled with a first electrode on the fourth transistor and a second electrode coupled to a second electrode on the third transistor;
   a sixth transistor having a control electrode coupled with a first electrode on the third transistor and a second electrode coupled with a second electrode on the fourth transistor;
   a seventh transistor coupled between the second electrode of the fifth transistor and a data line that is controlled by a second control signal;
   an eighth transistor coupled between the second electrode of the sixth transistor and a data bar line, wherein the eighth transistor is controlled by the second control signal;
   a ninth transistor that has a second electrode coupled with first electrodes of the fifth and the sixth transistors, and a first electrode coupled with a first reference voltage, wherein the ninth transistor is controlled by a third control signal;
   a tenth transistor having a first electrode coupled with a second reference voltage and a second electrode coupled with the second electrode of the third transistor;
   an eleventh transistor having a first electrode coupled with the second reference voltage and a second electrode commonly coupled with the second electrode of the fourth transistor and a control electrode of the tenth transistor; and
   a twelfth transistor that equalizes the second electrodes of the tenth and the eleventh transistors.

15. The nonvolatile ferroelectric memory device of claim 14, wherein the tenth, the eleventh and the twelfth transistors are PMOS transistors, and the remaining transistors are NMOS transistors, wherein the first signal is received from a main bit line, and wherein the first, second and third control signals are a latch enable signal, a column selection signal and a sense amplifier activation signal.

16. The nonvolatile ferroelectric memory device of claim 14, wherein the third and the fourth transistors are held in a turned-on state during data writing, and a turned-off state during data reading.

17. The nonvolatile ferroelectric memory device of claim 6, wherein the pull-up sensing amplifier comprises:
   a seventh transistor having a first electrode coupled to a data line that is controlled by a selection control signal;
   an eighth transistor having a first electrode coupled to a data bar line, wherein the eighth transistor is controlled by the selection control signal;
   a tenth transistor having a first electrode coupled with a second reference voltage and a second electrode coupled with a second electrode of the seventh transistor;
   an eleventh transistor having a first electrode coupled with the second reference voltage and a second electrode commonly coupled with a second electrode of the eighth transistor and a control electrode of the tenth transistor, wherein a control electrode of the eleventh transistor is coupled to the second electrode of the tenth transistor; and
   a twelfth transistor that equalizes the second electrodes of the tenth and the eleventh transistors.

18. The nonvolatile ferroelectric memory device of claim 6, wherein the first pull-down sensing amplifier comprises:
   a first transistor that switches a first signal;
   a second transistor that switches a reference signal;
   a third transistor controlled by a first control signal that switches a signal from the first transistor;
   a fourth transistor controlled by the first control signal that switches a signal from the second transistor;
   a fifth transistor having a control electrode coupled with a first electrode on the fourth transistor and a second electrode coupled to a second electrode on the third transistor;
   a sixth transistor having a control electrode coupled with a first electrode on the third transistor and a second electrode coupled with a second electrode on the fourth transistor; and
   a ninth transistor that has a second electrode coupled with first electrodes of the fifth and the sixth transistors, and a first electrode coupled with a first reference voltage, wherein the ninth transistor is controlled by a third control signal.

19. The nonvolatile ferroelectric memory device of claim 18, wherein the pull-up sensing amplifier comprises:
   a seventh transistor having a first electrode coupled to a data line that is controlled by a selection control signal;
   an eighth transistor having a first electrode coupled to a data bar line, wherein the eighth transistor is controlled by the selection control signal;

a tenth transistor having a first electrode coupled with a second reference voltage and a second electrode coupled with a second electrode of the seventh transistor;

an eleventh transistor having a first electrode coupled with the second reference voltage and a second electrode commonly coupled with a second electrode of the eighth transistor and a control electrode of the tenth transistor, wherein a control electrode of the eleventh transistor is coupled to the second electrode of the tenth transistor; and a twelfth transistor that equalizes the second electrodes of the tenth and the eleventh transistors.

20. The nonvolatile ferroelectric memory device of claim 19, wherein the second electrode of the fifth transistor is coupled with the second electrode of the tenth transistor, and wherein the second electrode of the sixth transistor is coupled with the second electrode of the eleventh transistor.

21. The nonvolatile ferroelectric memory device of claim 6, wherein the second pull-down sensing amplifier has an identical system as the first pull-down sensing amplifier.

* * * * *